(12) United States Patent
Kim et al.

(10) Patent No.: US 11,789,089 B2
(45) Date of Patent: Oct. 17, 2023

(54) APPARATUS AND METHOD FOR DETECTING DEFECT OF BATTERY PACK

(71) Applicant: LG ENERGY SOLUTION, LTD., Seoul (KR)

(72) Inventors: Young-Joong Kim, Daejeon (KR); Jin-Hyun Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 127 days.

(21) Appl. No.: 17/311,909

(22) PCT Filed: May 21, 2020

(86) PCT No.: PCT/KR2020/006666
§ 371 (c)(1),
(2) Date: Jun. 8, 2021

(87) PCT Pub. No.: WO2020/242137
PCT Pub. Date: Dec. 3, 2020

(65) Prior Publication Data
US 2022/0026501 A1    Jan. 27, 2022

(30) Foreign Application Priority Data
May 30, 2019    (KR) .................. 10-2019-0063998

(51) Int. Cl.
*G01R 31/00* (2006.01)
*G01R 31/392* (2019.01)
(Continued)

(52) U.S. Cl.
CPC ....... *G01R 31/392* (2019.01); *G01R 27/2605* (2013.01); *G01R 31/3835* (2019.01);
(Continued)

(58) Field of Classification Search
CPC .................................................. G01R 31/392
(Continued)

(56) References Cited

U.S. PATENT DOCUMENTS 10,006,966 B2    6/2018    Tsuchiya et al.
2005/0073317 A1    4/2005    Yamamoto
(Continued)

FOREIGN PATENT DOCUMENTS

CN    102263539 A    11/2011
CN    102315680 A    1/2012
(Continued)

OTHER PUBLICATIONS

Extended European Search Report dated Mar. 22, 2022 for European Patent No. 20813837.0.
(Continued)

*Primary Examiner* — Vincent Q Nguyen
(74) *Attorney, Agent, or Firm* — Birch, Stewart, Kolasch & Birch, LLP

(57) ABSTRACT

The present disclosure relates to an apparatus and method for detecting a defect of a battery pack, and more particularly, to an apparatus and method for detecting a defect of a capacitor provided in the battery pack. According to the present disclosure, since a defect of a capacitor is detected using a noise signal, the defect of the capacitor in an assembled battery pack may be easily detected. In addition, since the present disclosure includes a compact circuit structure for noise signal output, noise signal filtering and voltage measurement, the cost for detecting a defect of the capacitor may be reduced.

15 Claims, 4 Drawing Sheets

(51) Int. Cl.
  *G01R 31/396* (2019.01)
  *G01R 31/3835* (2019.01)
  *G01R 27/26* (2006.01)
  *H01M 10/48* (2006.01)

(52) U.S. Cl.
  CPC .......... *G01R 31/396* (2019.01); *H01M 10/48* (2013.01); *H01M 10/482* (2013.01)

(58) Field of Classification Search
  USPC .......................................... 324/426, 432–435
  See application file for complete search history.

(56) References Cited

U.S. PATENT DOCUMENTS

| | | | |
|---|---|---|---|
| 2011/0031812 A1 | 2/2011 | Morimoto | |
| 2011/0292696 A1 | 12/2011 | Xiao et al. | |
| 2012/0004873 A1* | 1/2012 | Li | B60L 3/0046 |
| | | | 320/134 |
| 2012/0146652 A1* | 6/2012 | Aoki | G01R 31/396 |
| | | | 324/433 |
| 2012/0271572 A1 | 10/2012 | Xiao et al. | |
| 2013/0335095 A1 | 12/2013 | Kiuchi | |
| 2014/0152261 A1 | 6/2014 | Yamauchi et al. | |
| 2014/0217980 A1 | 8/2014 | Malrieu | |
| 2014/0239965 A1* | 8/2014 | Calderon | G01R 31/385 |
| | | | 324/433 |
| 2015/0162759 A1 | 6/2015 | Fujii et al. | |
| 2015/0260799 A1 | 9/2015 | Kuroda | |
| 2016/0097818 A1 | 4/2016 | Chiyajo et al. | |
| 2019/0271747 A1 | 9/2019 | Osaka et al. | |
| 2020/0028369 A1* | 1/2020 | Lupo | H01M 50/569 |

FOREIGN PATENT DOCUMENTS

| | | |
|---|---|---|
| CN | 203117320 U | 8/2013 |
| CN | 103954852 A | 7/2014 |
| JP | 7-27801 A | 1/1995 |
| JP | 7-159470 A | 6/1995 |
| JP | 2002-247771 A | 8/2002 |
| JP | 2010-243157 A | 10/2010 |
| JP | 2012-253861 A | 12/2012 |
| JP | 5928509 B2 | 6/2016 |
| JP | 2016-194428 A | 11/2016 |
| JP | 5194402 B2 | 9/2017 |
| JP | 6200139 B2 | 9/2017 |
| JP | 2018-179652 A | 11/2018 |
| KR | 10-0809267 B1 | 3/2008 |
| KR | 10-1027965 B1 | 4/2011 |
| KR | 10-2014-0062066 A | 6/2014 |
| KR | 10-1419754 B1 | 7/2014 |
| KR | 10-1887440 B1 | 8/2018 |
| KR | 10-1948344 B1 | 2/2019 |

OTHER PUBLICATIONS

Huang et al., "Li-ion Battery Parameter Identification with Low Pass Filter for Measurement Noise Rejection," 26th International Symposium on Industrial Electronics (ISIE), IEEE, 2017, pp. 2075-2080.

International Search Report (PCT/ISA/210) issued in PCT/KR2020/0066686, dated Sep. 15, 2020.

* cited by examiner

| FREQUENCY [Hz] | 10 | 100 | 500 | 1000 | 1591 | 1800 | 5000 |
|---|---|---|---|---|---|---|---|
| Vmax[mV] | 425.193 | 425.909 | 423.179 | 411.664 | 400.439 | 396.936 | 364.15 |
| Vmin[mV] | 246.152 | 246.761 | 249.548 | 262.504 | 272.287 | 275.792 | 308.578 |
| Vs[mV] | 179.041 | 179.148 | 173.631 | 149.16 | 128.152 | 121.144 | 55.572 |
| RATE OF ATTENUATION [%] | 0 | 0 | 3.021654 | 16.68947 | 28.4231 | 32.33729 | 68.9613 |

|    | F0  | F1  | F2  | F3  | F4  | F5  | F6  |
|----|-----|-----|-----|-----|-----|-----|-----|
| B1 | V10 | V11 | V12 | V13 | V14 | V15 | V16 |
| B2 | V20 | V21 | V22 | V23 | V24 | V25 | V26 |
| B3 | V30 | V31 | V32 | V33 | V34 | V35 | V36 |
| B4 | V40 | V41 | V42 | V43 | V44 | V45 | V46 |

|    | F1   | F2   | F3   | F4   | F5   | F6   |
|----|------|------|------|------|------|------|
| B1 | dB11 | dB12 | dB13 | dB14 | dB15 | dB16 |
| B2 | dB21 | dB22 | dB23 | dB24 | dB25 | dB26 |
| B3 | dB31 | dB32 | dB33 | dB34 | dB35 | dB36 |
| B4 | dB41 | dB42 | dB43 | dB44 | dB45 | dB46 |

APPARATUS AND METHOD FOR DETECTING DEFECT OF BATTERY PACK

TECHNICAL FIELD

The present application claims priority to Korean Patent Application No. 10-2019-0063998 filed on May 30, 2019 in the Republic of Korea, the disclosures of which are incorporated herein by reference.

The present disclosure relates to an apparatus and method for detecting a defect of a battery pack, and more particularly, to an apparatus and method for detecting a defect of a capacitor provided in the battery pack.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

A battery pack including a battery generally has a filter for filtering a ripple current or high frequency current, and the filter generally has a capacitor. Since the capacitor passes the high frequency current, the type of filter may be classified into a low pass filter or a high pass filter, depending on the location of the capacitor in the filter. That is, the capacitor included in the filter serves to filter the current in a certain frequency band so that the voltage of the battery may be more accurately measured.

If a defect occurs at the capacitor, the current in the frequency band to be filtered is not filtered, so that the voltage of the battery may be measured incorrectly. If the voltage of the battery is not accurately measured, the state of charge (SOC) of the battery is calculated incorrectly, which may cause various problems.

Patent Literature 1 discloses a configuration that outputs an analog signal according to a voltage of a battery and inputs the output analog signal to a plurality of filters to filter the output analog signal. However, Patent Literature 1 only discloses that the plurality of filters are used to filter a high frequency signal higher than a cut-off frequency included in the analog signal, and does not disclose a configuration for detecting a defect in the capacitor included in the filter at all.
(Patent Literature 1) JP 2010-243157 A

DISCLOSURE

Technical Problem

The present disclosure is designed to solve the problems of the related art, and therefore the present disclosure is directed to providing an apparatus and method for detecting a defect of a battery pack, which calculates a capacitance of a capacitor included in a filter in a non-destructive manner and detects a defect of the capacitor.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof Technical Solution In one aspect of the present disclosure, there is provided an apparatus for detecting a defect of a battery pack, comprising: a voltage measurer configured to measure a voltage of a battery cell through a sensing line; a filter unit having a capacitor corresponding to the battery cell and configured to filter a noise included in the voltage measured by the voltage measurer through the capacitor with respect to the corresponding battery cell; a signal generator connected to the filter unit through a line having a noise resistor and configured to output a noise signal having an output frequency corresponding to frequency information to the filter unit when a control signal having the frequency information is input; and a controller connected to the voltage measurer and the signal generator and configured to send the control signal having the frequency information to the signal generator, receive the voltage value of the battery cell measured by the voltage measurer and detect a defect of the capacitor included in the filter unit based on the received voltage value of the battery cell and a preset reference value, the controller being a hardware embedded processor.

When the battery cell is provided in plural inside the battery pack, the controller may be configured to receive a voltage value of each of the plurality of battery cells measured by the voltage measurer and detect a defect of the capacitor corresponding to each of the plurality of battery cells based on the received voltage value of each of the plurality of battery cells and the preset reference value.

The filter unit may further include a filter resistor connected to the battery cell in series, and the capacitor of the filter unit is connected to a node between the filter resistor and the voltage measurer on the sensing line and is connected to the corresponding battery cell in parallel.

The signal generator may be connected to the node through a noise line having the noise resistor.

In another aspect of the present disclosure, when the battery cell is among a plurality of battery cells within the battery pack, the apparatus may further comprise a line branching unit configured to branch at least a portion of the noise line into a plurality of branching lines.

Each of the plurality of branching lines may be connected to a node corresponding to each of the plurality of battery cells.

The noise resistor may be provided between the line branching unit and the signal generator on the noise line.

The controller may be configured to calculate a target voltage value based on the voltage value received for the battery cell, compare the calculated target voltage value with the preset reference value, select an output frequency according to the comparison result, and determine based on the selected output frequency whether the capacitor has a defect.

The controller may be configured to receive a maximum voltage value and a minimum voltage value for the battery cell from the voltage measurer and calculate the target voltage value based on a difference between the maximum voltage value and the minimum voltage value.

The controller may be configured to calculate a capacitance of the capacitor corresponding to the battery cell by using the selected output frequency and a resistance value of the noise resistor.

In still another aspect of the present disclosure, the apparatus may further comprise memory provided with a frequency-voltage table to correspond to the battery cell so that the output frequency of the output noise signal and the voltage value measured by the voltage measurer are stored in the memory to be mapped with each other.

The controller may be configured to change the frequency information and send a control signal including the changed frequency information to the signal generator.

The controller may be configured to change the frequency information within a preset frequency range according to an initial capacitance of the capacitor and a resistance value of the noise resistor.

The controller may be configured to change the frequency information by a preset frequency interval within the preset frequency range.

The preset frequency interval may be a frequency interval set in advance based on a size of a minimum voltage measurable by the voltage measurer.

Before changing the frequency information within the preset frequency range, the controller may be configured to send a control signal to the signal generator, the control signal including frequency information of a predetermined reserve frequency selected in a frequency range less than the preset frequency range, receive the voltage value of the battery cell measured by the voltage measurer as a noise signal having an output frequency corresponding to the reserve frequency is output by the signal generator, calculate a reserve voltage value based on the received voltage value, and detect a defect of the capacitor included in the filter unit based on the calculated reserve voltage value of the battery cell and a preset reference voltage value.

In still another aspect of the present disclosure, there is also provided a battery pack, comprising the apparatus for detecting a defect of a battery pack according to an aspect of the present disclosure.

In still another aspect of the present disclosure, there is also provided a method for detecting a defect of a battery pack, comprising: a noise signal outputting step of outputting a noise signal having an output frequency corresponding to frequency information, when a control signal including the frequency information is input; a voltage measuring step of measuring a voltage of a battery cell of the battery pack at which a partial frequency band is filtered, after the noise signal is output; and a defect detecting step of detecting a defect of a capacitor corresponding to the battery cell based on the voltage value measured in the voltage measuring step and a preset reference value.

Advantageous Effects

According to the present disclosure, since a defect of a capacitor is detected using a noise signal, the defect of the capacitor in an assembled battery pack may be easily detected.

In addition, since the present disclosure includes a compact circuit structure for noise signal output, noise signal filtering and voltage measurement, the cost for detecting a defect of the capacitor may be reduced.

In addition, according to the present disclosure, since information such as a measurement voltage of a battery cell and a capacitance of the capacitor is provided to a user, the user may grasp a tendency such as a degree of degradation of the capacitor and/or a speed of degradation.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
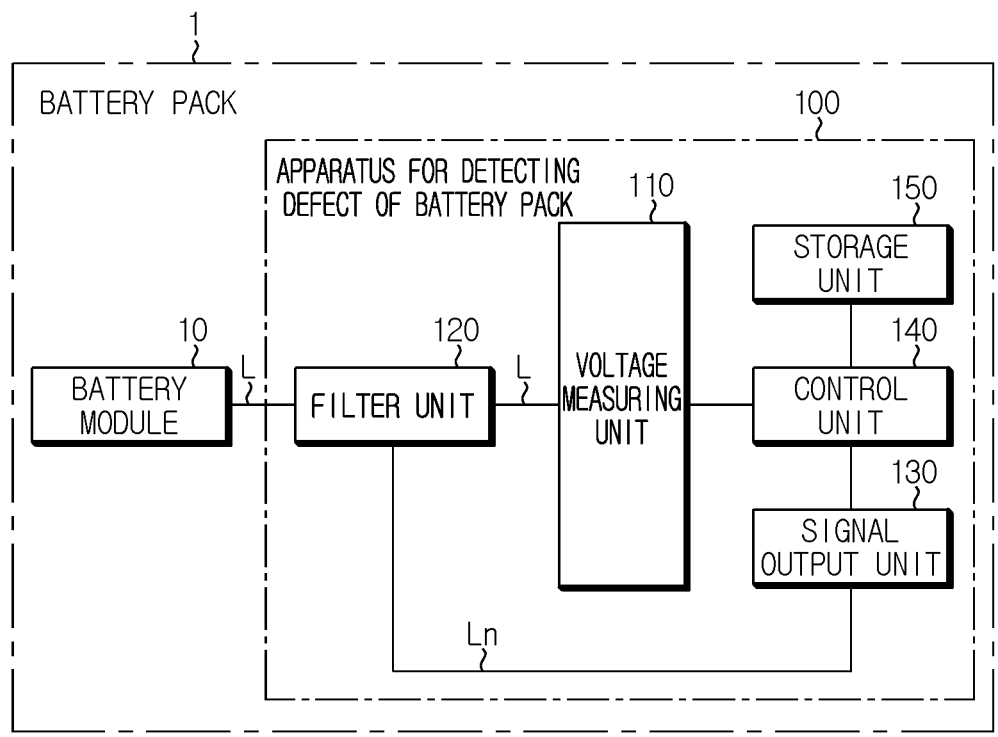
FIG. 1 is a diagram exemplarily showing an apparatus for detecting a defect of a battery pack according to an embodiment of the present disclosure.
Figure 2:
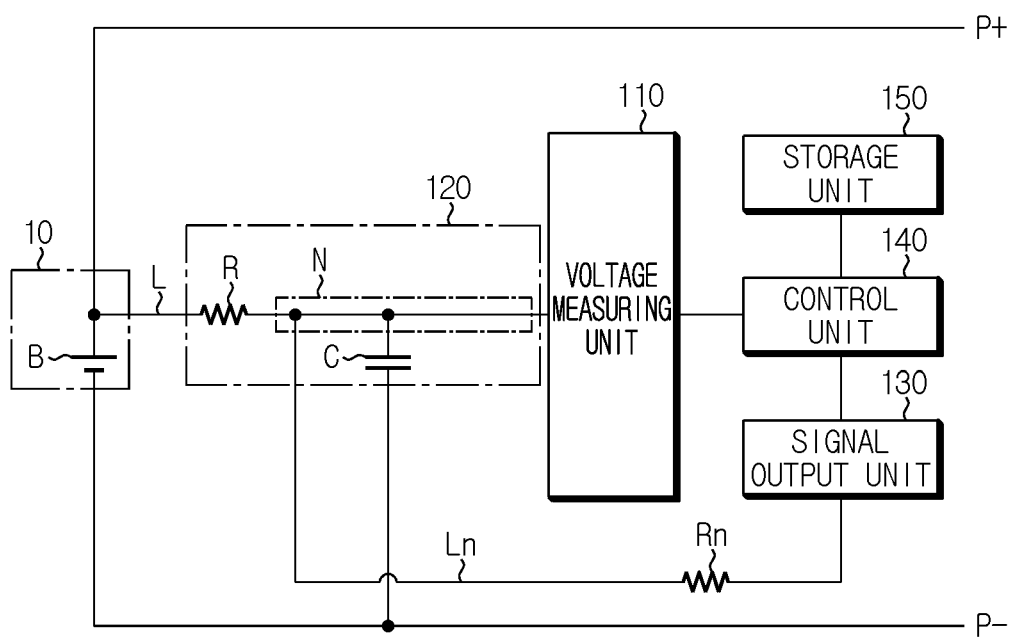
FIG. 2 is a diagram showing an example of the apparatus for detecting a defect of a battery pack according to an embodiment of the present disclosure.

FIG. 1 is a diagram exemplarily showing an apparatus 100 for detecting a defect of a battery pack according to an embodiment of the present disclosure. FIG. 2 is a diagram showing an example of the apparatus 100 for detecting a defect of a battery pack according to an embodiment of the present disclosure.

Referring to FIG. 1, an apparatus 100 for detecting a defect of a battery pack 1 according to an embodiment of the present disclosure may be included in the battery pack 1. That is, the battery pack 1 may include a battery module 10 and the apparatus 100 for detecting a defect of a battery pack. Here, the battery module 10 may include a single battery cell B or a plurality of battery cells B.

In the embodiment of FIG. 1, the apparatus 100 for detecting a defect of a battery pack 1 according to an embodiment of the present disclosure may include a voltage measuring unit 110 (i.e. sensor), a filter unit 120, a signal output unit 130, a control unit 140, and a storage unit 150.

The voltage measuring unit 110 may be configured to measure a voltage of the battery cell B through a sensing line L. For example, one end of the sensing line L may be connected to an electrode lead of the battery module 10, and the other end of the sensing line L may be connected to an input terminal of the voltage measuring unit 110. Therefore, the voltage measuring unit 110 may measure the voltage of the battery cell B included in the battery module 10 through the sensing line L.

For example, in the embodiment of FIG. 2, it is assumed that one battery cell B is included in the battery module 10. The voltage measuring unit 110 may be configured to measure the voltage of the battery cell B through the sensing line L connected to the battery cell B. Specifically, between a positive electrode of the battery cell B and the input terminal of the voltage measuring unit 110 may be connected through the sensing line L.

The filter unit 120 may include a capacitor C formed to correspond to the battery cell B. At this time, the capacitor C may be connected to the battery cell B in series or in parallel.

For example, in the embodiment of FIG. 2, since one battery cell B is included in the battery module 10, the filter unit 120 may include one capacitor C.

In addition, the filter unit 120 may be configured to filter noise included in the voltage measured by the voltage measuring unit 110 with respect to the corresponding battery cell B through the capacitor C.

For example, in the embodiments of FIGS. 1 and 2, the filter unit 120 may be provided between the battery module 10 and the voltage measuring unit 110 to filter noise included in the voltage measured by the voltage measuring unit 110. Here, the filter unit 120 may be configured using a low pass filter or a high pass filter. FIG. 2 shows an embodiment where the filter unit 120 is configured using a low pass filter. For convenience of explanation, it will be described that the filter unit 120 is configured using a low pass filter.

More specifically, in the embodiment of FIG. 2, the filter unit 120 may include a capacitor C and a filter resistor R. Here, the capacitor C of the filter unit 120 may be connected to the battery cell B in parallel. For example, one end of the capacitor C may be connected to the sensing line L and the other end of the capacitor C may be connected to a negative electrode terminal (a pack terminal, P−) of the battery module 10.

In addition, the filter resistor R of the filter unit 120 may be provided on the sensing line L. For example, as shown in FIG. 2, the filter resistor R may be provided between a positive electrode terminal (a pack terminal, P+) of the battery module 10 and a point at which the capacitor C is connected.

By the configuration where the filter unit 120 includes the capacitor C and the filter resistor R, the voltage measuring unit 110 may measure a voltage at which a high frequency higher than a cut-off frequency of the filter unit 120 is attenuated. That is, according to the characteristic of the capacitor C through which the high frequency may pass, the voltage measuring unit 110 may measure the voltage of the battery cell B at which a high frequency is attenuated.

The signal output unit 130 may be connected to the filter unit 120 through a line having a noise resistor Rn.

For example, in the embodiment of FIG. 2, the signal output unit 130 may be connected to the filter unit 120 through a noise line Ln having the noise resistor Rn. Here, the noise resistor Rn is a resistor whose resistance value is known in advance, and may be a resistor having a small variation in resistance value.

At this time, the noise resistor Rn is more preferred when its size is smaller. For example, if the size of the noise resistor Rn is too large, the size of the noise signal output from the signal output unit 130 may be greatly reduced. In this case, even if noise signals having different output frequencies are output from the signal output unit 130, the sizes of the signals input to the filter unit 120 may be small due to the noise resistor Rn, and the difference between the signals input to the filter unit 120 may be insignificant. Also, if the size of the noise resistor Rn is too large, fluctuations caused by external factors may be severe. For example, if the size of the noise resistor Rn is too great, the noise resistor Rn may change by a corresponding size according to external factors such as temperature or humidity inside the battery pack 1. Therefore, the size of the noise resistor Rn may be set to be small so that the reliability and accuracy for detecting a defect of the battery pack is less affected by the external factors.

In addition, the signal output unit 130 may receive a control signal including frequency information. For example, the signal output unit 130 may receive the control signal from the control unit 140.

If the control signal is input, the signal output unit 130 may be configured to output a noise signal having an output frequency corresponding to the frequency information included in the control signal to the filter unit 120. Here, the frequency information may include information about the output frequency included in the noise signal output from the signal output unit 130. That is, the signal output unit 130 may output a signal having a frequency, and may output a noise signal having a frequency corresponding to the frequency information included in the input control signal.

For example, in the embodiment of FIG. 2, if the signal output unit 130 receives a control signal including x [Hz] frequency information from the control unit 140, the signal output unit 130 may output a noise signal having an x [Hz] frequency through the noise line Ln. Accordingly, the noise signal having an x [Hz] frequency may be input to the filter unit 120 through the noise line Ln. Specifically, the output noise signal may be applied to the sensing line L, and the output noise signal may be combined with the voltage measurement signal of battery cell B input to the voltage measuring unit 110. In addition, in the voltage measurement signal combined with the noise signal, the high frequency component may be filtered by the filter unit 120. That is, in the voltage measurement signal combined with the noise signal, the high frequency component may pass through the capacitor C and proceed to the negative electrode terminal (P−) of the battery pack 1. Accordingly, the voltage measuring unit 110 may receive the voltage measurement signal of the battery cell B whose high frequency component is filtered, and measure the voltage of the battery cell B. Here, in the embodiment of FIG. 2, it should be noted for convenience of explanation that the high frequency component passing through the capacitor C is shown to proceed to the negative electrode terminal (P−) of the battery pack 1. That is, if the battery pack 1 has a separate ground terminal connected to the capacitor C, the high frequency component passing through the capacitor C may proceed to the ground terminal.

The control unit 140 may be connected to the voltage measuring unit 110 and the signal output unit 130. For example, referring to FIGS. 1 and 2, the control unit 140 may be connected to the voltage measuring unit 110 and the signal output unit 130 by wire. Accordingly, the control unit 140 may send and receive signals to/from the voltage measuring unit 110 and the signal output unit 130.

In addition, the control unit 140 may be configured to send a control signal to the signal output unit 130. As described above, frequency information may be included in the control signal sent to the signal output unit.

For example, the control unit 140 may send a control signal including frequency information to the signal output unit 130. If the signal output unit 130 receives the control signal including the frequency information from the control unit 140, the signal output unit 130 may output a noise signal having an output frequency corresponding to the frequency information included in the control signal through the noise line Ln. Accordingly, the noise signal having the output frequency may be input to the filter unit 120.

Specifically, in the embodiment of FIG. 2, the control unit 140 may send a control signal including x [Hz] frequency information to the signal output unit 130. The signal output unit 130 may output a noise signal including the x [Hz] output frequency through the noise line Ln. The noise signal output through the noise line Ln may be applied to the sensing line L. In addition, the high frequency component included in the noise signal may be filtered by the filter unit 120.

In addition, the control unit 140 may be configured to receive the voltage value of the battery cell B measured by the voltage measuring unit 110. Here, the voltage value of the battery cell B measured by the voltage measuring unit 110 may be a voltage value where the high frequency is filtered by the filter unit 120.

For example, some or all of the noise signal output from the signal output unit 130 may be filtered by the filter unit 120 according to the output frequency, and the voltage measuring unit 110 may measure the voltage of the battery cell B including the filtered noise signal. In addition, the control unit 140 may receive the voltage value of the battery cell B from the voltage measuring unit 110.

Specifically, the noise signal output by the signal output unit 130 may be filtered by the filter unit 120. In this case, a high frequency component higher than the cut-off frequency included in the noise signal is attenuated by the filter unit 120, so that the high frequency component included in the noise signal may be filtered. Here, the cut-off frequency may be a frequency value based on a capacitance of the capacitor C. That is, as the capacitance of the capacitor C is smaller, the frequency band to be filtered may be reduced. Therefore, a defect in the capacitor C may be detected according to the filtering result of the capacitor C. The correlation equation for the capacitor C and the cut-off frequency will be described below.

In addition, the control unit 140 may be configured to detect a defect of the capacitor C included in the filter unit 120 based on the received voltage value of the battery cell B and a preset reference value. For example, in the embodiment of FIG. 2, the control unit 140 may compare the received voltage value of the battery cell B with the preset reference value and detect a defect of the capacitor C included in filter unit 120 based on the comparison result.

For example, if a defect occurs in the capacitor C included in the filter unit 120 of the battery pack, the defect affects filtering by the filter unit 120, and thus the voltage of the battery cell B is not accurately measured. In addition, if the voltage of the battery cell B is not accurately measured, the state of charge (SOC) of the battery cell B may be estimated inaccurately, resulting in a problem that the battery cell B is overcharged or overdischarged. In addition, since the voltage of the battery cell B is not accurately measured, various unexpected problems such as swelling, ignition or explosion of the battery cell B may occur.

That is, the filtering performance of the capacitor C may be confirmed based on the filtering result of the noise signal, and a defect of the capacitor C may be detected based on the checked filtering performance. Therefore, the apparatus 100 for detecting a defect of a battery pack according to an embodiment of the present disclosure has an advantage of easily detecting a defect of the capacitor C provided inside an assembled battery pack 1 in a non-destructive manner.

If a plurality of battery cells B are provided in the battery pack 1, the control unit 140 may be configured to receive a voltage value of each of the plurality of battery cells B measured by the voltage measuring unit 110. An example where the plurality of battery cells B are included in the battery module 10 will be described with reference to FIG. 3.

Figure 3:
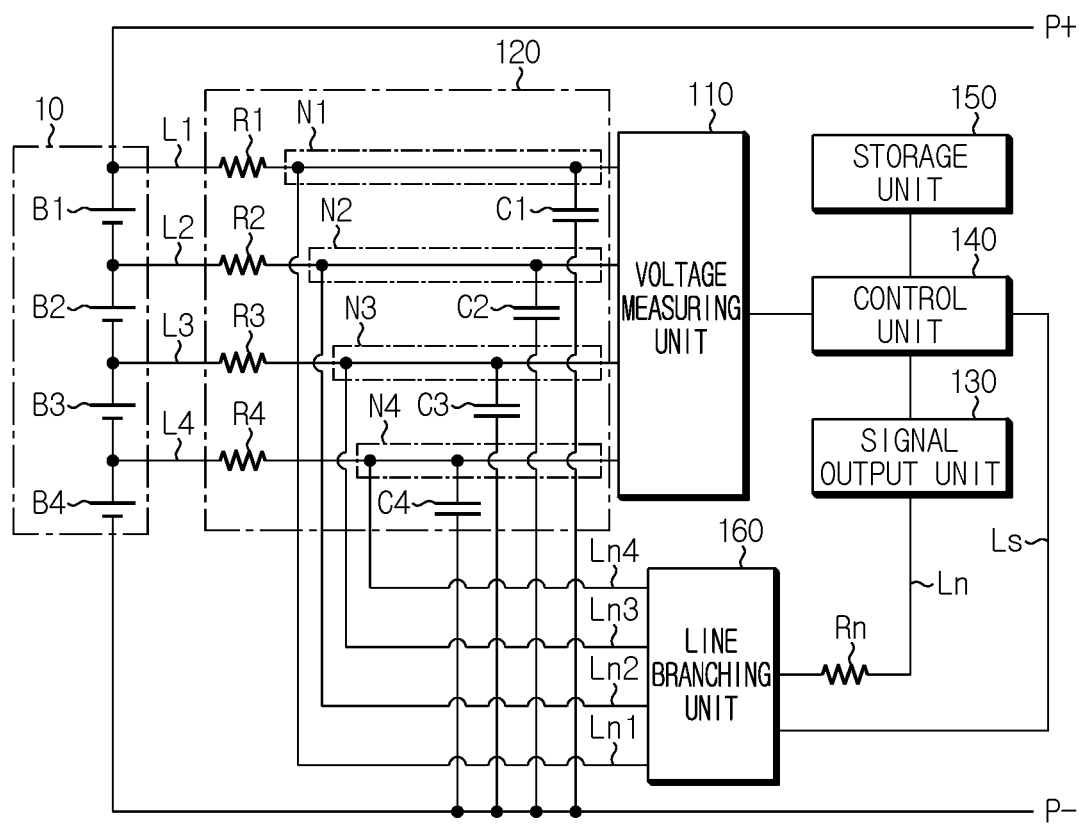
FIG. 3 is a diagram showing another example of the apparatus for detecting a defect of a battery pack according to an embodiment of the present disclosure.

FIG. 3 is a diagram showing another example of the apparatus 100 for detecting a defect of a battery pack according to an embodiment of the present disclosure.

In the embodiment of FIG. 3, the battery module 10 may include a plurality of battery cells B. For example, battery module 10 may include a first battery cell B1, a second battery cell B2, a third battery cell B3, and a fourth battery cell B4.

A first sensing line L1 may be connected to a positive electrode terminal of the first battery cell B1 and the voltage measuring unit 110, and a second sensing line L2 may be connected to a positive electrode terminal of the second battery cell B2 and the voltage measuring unit 110. A third sensing line L3 may be connected to a positive electrode terminal of the third battery cell B3 and the voltage measuring unit 110, and a fourth sensing line L4 may be connected to a positive electrode terminal of the fourth battery cell B4 and the voltage measuring unit 110.

The voltage measuring unit 110 may measure a voltage of the first battery cell B1 through the first sensing line L1 and measure a voltage of the second battery cell B2 through the second sensing line L2. In addition, the voltage measuring unit 110 may measure a voltage of the third battery cell B3 through the third sensing line L3 and measure a voltage of the fourth battery cell B4 through the fourth sensing line L4.

The noise signal outputted by the signal output unit 130 may be input to each of the sensing lines L1, L2, L3 and L4 through the noise line Ln. For example, if a plurality of noise lines Ln are provided, each noise line may be connected to each of the sensing lines L1, L2, L3, and L4. As another example, if one noise line Ln is provided, the noise line Ln may be branched into a plurality of branching lines, and each of the plurality of branching lines may be connected to each of the sensing lines L1, L2, L3, and L4.

In the embodiment of FIG. 3, one noise line Ln is provided. Referring to the embodiment of FIG. 3, the noise line Ln may be connected to the first sensing line L1, the second sensing line L2, the third sensing line L3 and the fourth sensing line L4, respectively. More specifically, the noise line Ln may be connected to a first node N1 between a first resistor R1 and the voltage measuring unit 110 on the first sensing line L1. In addition, the noise line Ln may be connected to a second node N2 between a second resistor R2 and the voltage measuring unit 110 on the second sensing line L2. Also, the noise line Ln may be connected to a third node N3 between a third resistor R3 and the voltage measuring unit 110 on the third sensing line L3. In addition, the noise line Ln may be connected to a fourth node N4 between a fourth resistor R4 and the voltage measuring unit 110 on the fourth sensing line L4.

In this configuration, the noise signal output by the signal output unit 130 may be input to the first node N1, the second node N2, the third node N3 and the fourth node N4, respectively. In addition, the noise signal may be filtered by each of a first capacitor C1, a second capacitor C2, a third capacitor C3 and a fourth capacitor C4 included in the filter unit 120. The voltage measuring unit 110 may send the measured voltage value for each of the first battery cell B1, the second battery cell B2, the third battery cell B3 and the fourth battery cell B4 to the control unit 140.

In addition, the control unit 140 may be configured to detect a defect of the capacitor C corresponding to each of the plurality of battery cells B, based on the received voltage value of each of the plurality of battery cells B and the preset reference value.

In the embodiment of FIG. 3, the first capacitor C1 is a capacitor corresponding to the first battery cell B1, and may be connected to the first battery cell B1 in parallel so that one end of the first capacitor C1 is connected to the first node N1 and the other end of the first capacitor C1 is connected to the negative electrode terminal (a pack terminal, P−) of the battery module 10.

The second capacitor C2 is a capacitor corresponding to the second battery cell B2, may be connected to the second battery cell B2 in parallel so that one end of the second capacitor C2 is connected to the second node N2 and the other end of the second capacitor C2 is connected to the negative electrode terminal (a pack terminal, P−) of the battery module 10.

The third capacitor C3 is a capacitor corresponding to the third battery cell B3, may be connected to the third battery cell B3 in parallel so that one end of the third capacitor C3 is connected to the third node N3 and the other end of the third capacitor C3 is connected to the negative electrode terminal (a pack terminal, P−) of the battery module 10.

The fourth capacitor C4 is a capacitor corresponding to the fourth battery cell B4, may be connected to the fourth battery cell B4 in parallel so that one end of the fourth capacitor C4 is connected to the fourth node N4 and the other end of the fourth capacitor C4 is connected to the negative electrode terminal (a pack terminal, P−) of the battery module 10.

The control unit 140 may detect a defect of the first capacitor C1 based on the voltage value of the first battery cell B1 and the preset reference value, and detect a defect of the second capacitor C2 based on the voltage value of the second battery cell B2 and the preset reference value. In addition, the control unit 140 may detect a defect of the third capacitor C3 based on the voltage value of the third battery cell B3 and the preset reference value, and detect a defect of the fourth capacitor C4 based on the voltage value of the fourth battery cell B4 and the preset reference value. Here, the preset reference value may refer to a certain value or a certain value range.

That is, the apparatus 100 for detecting a defect of a battery pack according to an embodiment of the present disclosure may determine whether the capacitor C corresponding to any battery cell B has a defect by independently determining whether each capacitor C corresponding to each battery cell B has a defect. Accordingly, the apparatus 100 for detecting a defect of a battery pack according to an embodiment of the present disclosure may provide information on the capacitor C where a defect is detected to the user. In addition, by disconnecting the connection between the capacitor C where the defect is detected and the battery cell B corresponding to the capacitor C, any problems that may be caused by incorrectly measuring the voltage of the corresponding battery cell B may be prevented in advance.

Here, the control unit 140 may selectively include processors known in the art, application-specific integrated circuit (ASIC), other chipsets, logic circuits, registers, communication modems, data processing devices, and the like to execute various control logic performed in the apparatus 100 for detecting a defect of a battery pack according to an embodiment of the present disclosure. Also, when the control logic is implemented in software, the control unit 140 may be implemented as a set of program modules. At this time, the program module may be stored in a memory and executed by a processor. The memory may be located inside or out of the processor and may be connected to the processor by various well-known means.

In addition, referring to FIG. 2, the apparatus 100 for detecting a defect of a battery pack according to an embodiment of the present disclosure may further include a storage unit 150. Here, the storage unit 150 may store a resistance value of the noise resistor Rn, an output voltage value of the battery cell B in a BOL (Beginning of Life) state, and the like. That is, the storage unit 150 may store data necessary for operation and function of each component of the apparatus 100 for detecting a defect of a battery pack according to an embodiment of the present disclosure, data generated in the process of performing the operation or function, or the like. The storage unit 150 is not particularly limited in its kind as long as it is a known information storage means that can record, erase, update and read data. As an example, the information storage means may include RAM (Random Access Memory), flash memory, ROM (Read Only Memory), EEPROM (Electrically Erasable Programmable Read only Memory), registers, and the like. The storage unit 150 may store programs or program codes in which processes executable by the control unit 140 are defined.

The filter unit 120 may include a filter resistor R located on the sensing line and connected to the battery cell B in series and a capacitor C connected to the node N between the filter resistor R and the voltage measuring unit 110 on the sensing line L to be connected to the corresponding battery cell B in parallel.

For example, in the embodiment of FIG. 2, the filter unit 120 may include a low pass filter having a structure including the resistor R and the capacitor C. That is, the filter unit 120 may include the filter resistor R provided on the sensing line L and connected to the battery cell B in series. Hereinafter, for convenience of explanation, the line between the filter resistor R and the voltage measuring unit 110 on the sensing line L will be referred to as the node N. One end of the capacitor C may be connected to the node N.

If the filter unit 120 is provided as a high pass filter, the locations of the filter resistor R and the capacitor C may be changed from each other in the embodiment of FIG. 2.

In addition, in the embodiment of FIG. 3, the locations of the capacitors C1, C2, C3 and C4 corresponding to the filter resistors R1, R2, R3 and R4 may be changed from each other.

The signal output unit 130 may be configured to be connected to the node N through the noise line Ln having the noise resistor Rn. That is, the signal output unit 130 may be connected to the filter unit 120 through the noise line Ln.

For example, in the embodiment of FIG. 2, the noise line Ln may be connected to the node N, and the noise resistor Rn may be provided to the noise line Ln. Preferably, the noise line Ln may be connected between a point where one end of the capacitor C is connected and the filter resistor R on the node N. Accordingly, the high frequency of the noise signal output from the signal output unit 130 may be filtered through the capacitor C.

That is, the apparatus 100 for detecting a defect of a battery pack according to an embodiment of the present disclosure has an advantage of filtering the frequency of a certain band included in the measured voltage by using the filter provided for each battery cell B. For example, the apparatus 100 may filter ripple signals and noise high frequency signals. In addition, the apparatus 100 for detecting a defect of a battery pack has the capacitor C corresponding to each battery cell B, and has an advantage of independently detecting a defect of each capacitor C.

The apparatus 100 for detecting a defect of a battery pack 1 according to an embodiment of the present disclosure may further include a line branching unit 160 configured to branch at least a portion of the noise line Ln into a plurality of branching lines, when a plurality of battery cells B are provided in the battery pack 1. In addition, the line branching unit 160 may be electrically connected to the control unit 140.

For example, in the embodiment of FIG. 3, the line branching unit 160 may branch the noise line Ln into a first branching line Ln1, a second branching line Ln2, a third branching line Ln3, and a fourth branching line Ln4. In addition, the line branching unit 160 may be connected to the signal output unit 130 through the noise line Ln. The line branching unit 160 may also be connected to the filter unit 120 through the first branching line Ln1, the second branching line Ln2, the third branching line Ln3, and the fourth branching line Ln4.

The number of branching lines connecting the line branching unit 160 and the filter unit 120 may correspond to the number of battery cells B1 to B4 included in the battery module 10. That is, in the embodiment of FIG. 3, since the number of battery cells included in the battery module 10 is 4, the number of branching lines may also be 4.

The plurality of branching lines may be connected to nodes corresponding to the plurality of battery cells, respectively.

That is, the line branching unit 160 may be connected to the nodes N1 to N4 respectively corresponding to the plurality of sensing lines L1 to L4 through the plurality of branching lines Ln1 to Ln4.

For example, in the embodiment of FIG. 3, the line branching unit 160 may branch the noise line Ln into a first branching line Ln1, a second branching line Ln2, a third branching line Ln3, and a fourth branching line Ln4. The first branching line Ln1, the second branching line Ln2, the third branching line Ln3, and the fourth branching line Ln4 may be connected to the first node N1, the second node N2, the third node N3, and the fourth node N4, respectively.

Specifically, in the embodiment of FIG. 3, the first branching line Ln1 may be connected between the point where one end of the first capacitor C1 is connected and the first filter resistor R1 on the first node N1, and the noise signal may be applied to the first node N1 through the first branching line Ln1.

Similarly, the second branching line Ln2 may be connected between the second filter resistor R2 and the point where one end of the second capacitor C2 is connected on the second node N2, and the noise signal may be applied to the second node N2 through the second branching line Ln2.

In addition, the third branching line Ln3 may be connected between the third filter resistor R3 and the point where one end of the third capacitor C3 is connected on the third node N3, and the noise signal may be applied to the third node N3 through the third branching line Ln3.

The fourth branching line Ln4 may be connected between the fourth filter resistor R4 and the point where one end of the fourth capacitor C4 is connected on the fourth node N4, and the noise signal may be applied to the fourth node N4 through the fourth branching line Ln4.

Here, the line branching unit 160 may be provided in a structure including a de-multiplexer (DEMUR) or a plurality of switches.

Figure 4:
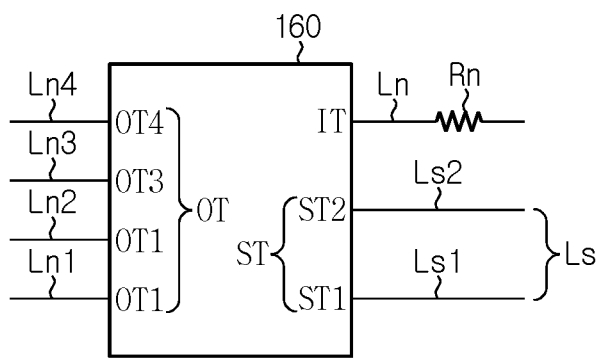
FIG. 4 is a diagram showing an example of a line branching unit in the apparatus for detecting a defect of a battery pack according to an embodiment of the present disclosure.

FIG. 4 is a diagram showing an example of a line branching unit in the apparatus for detecting a defect of a battery pack according to an embodiment of the present disclosure.

Referring to FIG. 4, the line branching unit 160 may be provided as a de-multiplexer. The line branching unit 160 may be a de-multiplexer to which an n number of input lines are connected and an m number of output lines are connected. Here, both m and n are positive integers, and m is greater than n by the definition of the de-multiplexer.

In addition, the line branching unit 160 provided as a de-multiplexer may include an input terminal IT, a serial terminal ST, and an output terminal OT. For example, in the embodiment of FIG. 4, since the number of battery cells included in the battery module 10 is 4, the line branching unit 160 may include one input terminal IT, two serial terminals ST, and four output terminals OT. That is, the line branching unit 160 may include an input terminal IT, a first serial terminal ST1, a second serial terminal ST2, a first output terminal OT1, a second output terminal OT2, a third output terminal OT3, and a fourth output terminal OT4.

The noise line Ln may be connected to the input terminal IT, and the noise signal output from the signal output unit 130 may be input to the input terminal IT.

A branching control line Ls may be connected to the serial terminal ST, and the line branching unit 160 may be connected to the control unit 140 through the branching control line Ls. The control unit 140 may send a branching command through the branching control line Ls, and the line branching unit 160 may select a terminal for outputting the noise signal input to the input terminal IT among the output terminals OT according to the received branching command. For example, if the number of lines branching to the maximum in the line branching unit 160 is N, the number of serial terminals ST may be an integer greater than 'Log$_2$N'. Preferably, the number of serial terminals ST may be the smallest integer among integers greater than 'Log$_2$N'. For example, if N is 4, the number of serial terminal STs may be 2 or more. As another example, if N is 7, since log$_2$7' is a number greater than 2 and less than 3, the integer greater than log$_2$7' is an integer greater than or equal to 3. However, preferably, the number of serial terminals ST may be 3.

In the example below, it is assumed that the branching control line Ls is provided as a first line Ls1 and a second line Ls2, as shown in FIG. 4. Also, for convenience of explanation, a pair of a signal output from the control unit 140 to the first line Ls1 and the second line Ls2 is expressed in the form of (x, x). For example, if the control unit 140 outputs an a signal to the first line Ls1 and outputs a b signal to the second line Ls2, it is expressed that the control unit 140 outputs a (b, a) signal.

For example, if the control unit 140 outputs a (0, 0) signal in a state where the noise signal is input through the input terminal IT, the line branching unit 160 may output the input noise signal through the first output terminal OT1.

As another example, if the control unit 140 outputs a (0, 1) signal in a state where the noise signal is input through the input terminal IT, the line branching unit 160 may output the input noise signal through the second output terminal OT2.

As another example, if the control unit 140 outputs a (1, 0) signal in a state where the noise signal is input through the input terminal IT, the line branching unit 160 may output the input noise signal through the third output terminal OT3.

As another example, when the control unit 140 outputs a (1, 1) signal in a state where the noise signal is input through the input terminal IT, the line branching unit 160 may output the input noise signal through the fourth output terminal OT4.

That is, the line branching unit 160 may select an output terminal to output the noise signal, based on a combination of signals input through the serial terminals ST.

As another example, if the control unit 140 outputs (0, 0), (0, 1), (1, 0) and (1, 1) signals in a state where the noise signal is input through the input terminal IT, the line branching unit 160 may output the input noise signal through the first output terminal OT1, the second output terminal OT2, the third output terminal OT3, and the fourth output terminal OT4.

The branching line may be connected to the output terminal OT, and the line branching unit 160 may be connected to the filter unit 120 through the branching line.

Preferably, the line branching unit 160 may be connected to each node included in the filter unit 120 through the branching line.

The first branching line Ln1 may be connected to the first output terminal OT1, and the second branching line Ln2 may be connected to the second output terminal OT2. The third branching line Ln3 may be connected to the third output terminal OT3, and the fourth branching line Ln4 may be connected to the fourth output terminal OT4.

For example, if the control unit 140 outputs both (0, 0) and (1, 1) signals in a state where the noise signal is input through the input terminal IT, the line branching unit 160 may output the input noise signal through the first output terminal OT1 and the fourth output terminal OT4. In this case, the noise signal output from the signal output unit 130 may be input to the first node N1 and the fourth node N4.

Figures 5, 6, 7, 8:
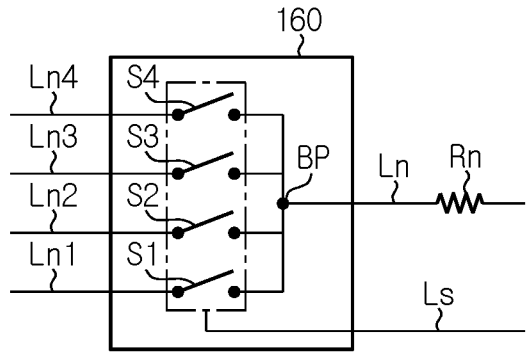
FIG. 5 is a diagram showing another example of the line branching unit in the apparatus for detecting a defect of a battery pack according to an embodiment of the present disclosure.
FIG. 6 shows experiment data obtained by detecting a defect of a capacitor by using the apparatus for detecting a defect of a battery pack according to an embodiment of the present disclosure.
FIG. 7 is a diagram showing an example of a frequency-voltage table stored in the apparatus for detecting a defect of a battery pack according to an embodiment of the present disclosure.
FIG. 8 is a diagram showing an example of a frequency-decibel table stored in the apparatus for detecting a defect of a battery pack according to an embodiment of the present disclosure.

FIG. 5 is a diagram showing another example of the line branching unit 160 in the apparatus for detecting a defect of a battery pack according to an embodiment of the present disclosure.

Referring to FIG. 5, the line branching unit 160 may include a plurality of branching lines Ln1 to Ln4 and a plurality of switches S1 to S4. Here, the types of the plurality of switches S1 to S4 may be selected without limitation, among mechanical switches, electronic switches and electric switches. However, in order to minimize the effect of the plurality of switches S1 to S4, all of the plurality of switches S1 to S4 may be provided as switches having the same type and specification. That is, if the first switch S1 is a FET, the second switch S2, the third switch S3, and the fourth switch S4 may also be FETs.

For example, the noise line Ln connected to the line branching unit 160 may branch into the first branching line Ln1, the second branching line Ln2, the third branching line Ln3 and the fourth branching line Ln4 based on a branching point (BP). In addition, the first switch S1 may be provided to the first branching line Ln1, and the second switch S2 may be provided to the second branching line Ln2. Also, the third switch S3 may be provided to the third branching line Ln3, and the fourth switch S4 may be provided to the fourth branching line Ln4.

Although schematically illustrated in FIG. 5, each of the plurality of switches S1 to S4 may be connected to the control unit 140 through the branching control line Ls. Accordingly, the control unit 140 may independently control the operating states of the first switch S1, the second switch S2, the third switch S3 and the fourth switch S4.

For example, the control unit 140 may control the operation states of the first switch S1 and the second switch S2 into a turn-on state, and control the operation states of the third switch S3 and the fourth switch S4 into a turn-off state. In this case, the noise signal input through the input terminal IT may be output through the first output terminal OT1 and the second output terminal OT2. That is, the noise signal may be applied to the first node N1 and the second node N2 through the first branching line Ln1 and the second branching line Ln2.

Since the apparatus 100 for detecting a defect of a battery pack according to an exemplary embodiment of the present application includes the line branching unit 160 for branching the noise line Ln into a plurality of branching lines, the circuit configuration is relatively simple, thereby having advantages of improving productivity and reducing production costs.

The noise resistor Rn may be provided between the line branching unit 160 and the signal output unit 130 on the noise line Ln.

In the embodiment of FIG. 3, even if the noise line Ln is branched to the first branching line Ln1, the second branching line Ln2, the third branching line Ln3 and the fourth branching line Ln4 by the line branching unit 160, the noise resistor Rn may be provided between the signal output unit 130 and the line branching unit 160.

Since the apparatus 100 for detecting a defect of a battery pack according to an embodiment of the present disclosure includes one noise resistor Rn, when detecting a defect of each capacitor C, it is possible to minimize the effect of the noise resistor Rn. Therefore, the defect of capacitor C may be detected more accurately.

Hereinafter, a process of detecting a defect of the capacitor C by comparing the voltage value of the battery cell B with a preset reference value will be described in detail.

The control unit 140 may calculate a target voltage value based on the voltage value received for the battery cell B. Here, the target voltage value refers to a value to be compared with the preset reference value, and the control unit 140 processes the voltage value of the battery cell B measured by the voltage measuring unit 110 to obtain the target voltage value.

Hereinafter, for convenience of explanation, it is assumed that the output voltage of the battery cell B is V [V].

For example, in FIG. 2, a DC current may be output from the battery cell B through the sensing line L. The output DC current may pass through the filter resistor R and be combined with the noise signal output from the signal output unit 130. At this time, since the noise signal is an AC current having a frequency, the voltage measuring unit 110 may measure a voltage value within a certain range based on V [V] as the output voltage of the battery cell B. The voltage measuring unit 110 may measure a maximum voltage value (Vmax) and a minimum voltage value (Vmin) of the battery cell B. In addition, the control unit 140 may calculate the target voltage value by processing the maximum voltage value and the minimum voltage value measured by the voltage measuring unit 110. For example, the control unit 140 may calculate the target voltage value based on a difference between the maximum voltage value and the minimum voltage value.

For example, the preset reference value is a value measured when the battery cell B is in an initial state, and the preset reference value is measured by the voltage measuring unit 110 when the signal output unit 130 outputs a noise signal having a frequency of a preset size. For example, when the battery cell B is in the initial state, the signal output unit 130 may output a noise signal having a size of about 100 [mV] and a very small output frequency of 10 [Hz]. In this case, the difference between the maximum voltage value and the minimum voltage value of the battery cell B measured by the voltage measuring unit 110 may be the preset reference value.

That is, the preset reference value may be different for each battery cell. For example, in the embodiment of FIG. 3, even if the first battery cell B1, the second battery cell B2, the third battery cell B3 and the fourth battery cell B4 are produced through the same process line, these battery cells may not be regarded as being completely identical due to a number of factors such as minute differences in internal resistors. Therefore, since the maximum voltage value and minimum voltage value measured for each battery cell may be different, the preset reference values for the first battery cell B1, the second battery cell B2, the third battery cell B3 and the fourth battery cell B4 may be different from each other.

The control unit 140 may compare the calculated target voltage value with the preset reference value. For example, the control unit 140 may calculate a ratio of the target voltage value to the preset reference value. That is, if the preset reference value is A [mV] and the target voltage value is B [mV], the control unit 140 may calculate '÷A×100' by comparing the target voltage value and the preset reference value.

In the embodiment of FIG. 3, if the noise signal is applied to all of the first node N1, the second node N2, the third node N3 and the fourth node N4, the control unit 140 may calculate the target voltage value for each of the first battery cell B1, the second battery cell B2, the third battery cell B3 and the fourth battery cell B4, and compare the calculated target voltage value with the preset reference value. In addition, the control unit 140 may calculate a first target voltage value for the first battery cell B1 and compare the first target voltage value with the preset reference value for the first battery cell B1. The control unit 140 may perform corresponding operations for the second battery cell B2, the third battery cell B3 and the fourth battery cell B4.

The control unit 140 may select an output frequency according to the comparison result of the calculated target voltage value and the preset reference value. Preferably, the control unit 140 may select an output frequency when the calculated target voltage value is approximately different from the preset reference value in a preset ratio.

For a specific example, the control unit 140 may send a control signal including a [Hz] frequency information to the signal output unit 130. In addition, when a noise signal having an output frequency of a [Hz] is output by the signal output unit 130, the control unit 140 may receive the maximum voltage value Vmax [mV] and the minimum voltage value Vmin [mV] of the battery cell B measured by the voltage measuring unit 110. The control unit 140 may calculate Vs [mV], which is a difference between the maximum voltage value Vmax [mV] and the minimum voltage value Vmin [mV], as the target voltage value. The control unit 140 may calculate a ratio of attenuation by comparing the calculated target voltage value Vs [mV] with a preset reference value Vo [mV]. Here, the ratio of attenuation may be calculated according to the formula of 'Vs÷Vo×100'. If the calculated ratio of attenuation is the preset ratio, the control unit 140 may select a [Hz] as the output frequency.

Preferably, the preset ratio may be '{1−(1÷√2)}×100', which is about 29.3%. Here, the calculated preset ratio of about 29.3% means that the frequency is attenuated by about 70.7% from the preset reference value. This preset ratio may be a ratio of frequency attenuation based on a cut-off frequency of the filter unit 120 equipped with the capacitor C. That is, the preset reference value may be a value calculated by outputting a noise signal with a very small frequency size, and the frequency when the ratio of attenuation is about 29.3% lower than the preset reference value may be the cut-off frequency of the filter unit 120 or a filtering path having the corresponding capacitor C. Accordingly, the control unit 140 may select a [Hz] as the output frequency, if the ratio of the calculated target voltage value Vs [mV] to the preset reference value Vo [mV] is approximately 29.3%.

The control unit 140 may be configured to determine whether the capacitor C has a defect, based on the selected output frequency.

For example, in the embodiment of FIG. 3, it is assumed that the control unit 140 selects a1 [Hz] as the output frequency for the first battery cell B1 and a2 [Hz] as the output frequency for the second battery cell B2. The control unit 140 may detect a defect of the first capacitor C1 corresponding to the first battery cell B1 based on a1 [Hz], and detect a defect of the second capacitor C2 corresponding to the second battery cell B2 based on a2 [Hz].

FIG. 6 shows experiment data obtained by detecting a defect of a capacitor C by using the apparatus 100 for detecting a defect of a battery pack according to an embodiment of the present disclosure.

The experiment for detecting a defect of the capacitor C was carried out after a single battery cell B and a single capacitor C were prepared as in the embodiment shown in FIG. 2.

Referring to FIG. 6, the control unit 140 may generate a control signal including frequency information of 10 [Hz], 100 [Hz], 500 [Hz], 1000 [Hz], 1591 [Hz], 1800 [Hz] and 5000 [Hz].

Referring to the second column in the table of FIG. 6, when the control unit 140 outputs a control signal including frequency information of 10 [Hz] to the signal output unit 130, the voltage measuring unit 110 may measure a voltage of 425.193 [mV] to 246.152 [mV]. The control unit 140 may receive the measured voltage value from the voltage measuring unit 110, and set an average of the maximum voltage value (Vmax) and the minimum voltage value (Vmin) as a reference value. In this case, the control unit 140 may calculate the average of the maximum voltage value (Vmax) of 425.193 [mV] and the minimum voltage value (Vmin) of 246.152 [mV], and set the calculated average value (Vs) of 179.041 [mV] as the reference value.

In the same way as above, the control unit 140 may generate a control signal including frequency information of 100 [Hz], 500 [Hz], 1000 [Hz], 1591 [Hz], 1800 [Hz] and 5000 [Hz], and calculate an average value (Vs) for each case. Here, the average value (Vs) corresponding to the frequency information of 100 [Hz], 500 [Hz], 1000 [Hz], 1591 [Hz], 1800 [Hz] and 5000 [Hz] refers to the target voltage value that is to be compared with the preset reference value.

In the embodiment of FIG. 6, the control unit 140 may calculate a ratio of attenuation, which is a ratio of the target voltage value to the preset reference value. In this case, the ratio of attenuation corresponding to 100 [Hz] frequency information may be calculated as about 0%, the ratio of attenuation corresponding to 500 [Hz] frequency information may be calculated as about 3.02%, the ratio of attenuation corresponding to 1000 [Hz] frequency information may be calculated as about 16.69%, the ratio of attenuation corresponding to 1591 [Hz] frequency information may be calculated as about 28.42%, the ratio of attenuation corresponding to 1800 [Hz] frequency information may be calculated as about 32.34%, the ratio of attenuation corresponding to 5000 [Hz] frequency information may be calculated as about 68.96%.

After that, the control unit 140 may select an output frequency according to the comparison result of the calculated target voltage value and the preset reference value. As in the former embodiment, the control unit 140 may select an output frequency when the calculated target voltage value is approximately different from the preset reference value by a preset ratio. Preferably, the control unit 140 may select 1591 [Hz] frequency information, where the calculated ratio of attenuation is closest to 29.3%, as the output frequency.

The control unit 140 may calculate a capacitance of the capacitor C based on the size of the selected 1591 [Hz] frequency.

The apparatus 100 for detecting a defect of a battery pack according to an embodiment of the present disclosure may detect a defect of the capacitor C corresponding to the battery cell B based on the selected output frequency. That is, by checking the filtering performance for the output noise signal, there is an advantage in that a defect of the capacitor C included in the filter unit 120 may be detected simply without disassembling the assembled battery pack 1.

As another embodiment, if the difference in decibel (dB) between the calculated target voltage value and the preset reference value is close to a preset decibel size, the control unit 140 may select an output frequency based on the calculated target voltage value. For example, the control unit 140 may calculate a decibel difference between the calculated target voltage value and the preset reference value using Equation 1 below.

$$dB = 20 \times \log(Vt \div Vo) \quad \text{[Equation 1]}$$

Here, dB refers to decibel, Vo and Vt refer to voltage values, Vo refer to the preset reference value, and Vt refer to the target voltage value.

For example, in the embodiment of FIG. 6, when a noise signal having a frequency of 10 [Hz] is output from the signal output unit 130, the preset reference value of the battery cell B measured by the voltage measuring unit 110 is 179.041 [mV]. In addition, when a noise signal having a frequency of 1591 [Hz] is output from the signal output unit 130, the maximum voltage value (Vmax) of the battery cell B measured by the voltage measuring unit 110 is 400.439 [mV], and the minimum voltage value (Vmin) is 272.287 [mV]. The control unit 140 may calculate the target voltage value as 128.152 [mV] based on the measured maximum voltage value (Vmax) and the measured minimum voltage value (Vmin).

In addition, the control unit 140 may calculate the decibel size between the preset reference value and the calculated target voltage value using Equation 1. The control unit 140 may calculate the decibel difference between the preset reference value and the calculated target voltage value as about −2.9 [dB], based on the calculation result of "20×log (128.152÷179.041)".

In addition, the control unit 140 may select the output frequency based on the comparison result of the calculated decibel difference and the preset decibel size. Preferably, the preset decibel size may be preset as −3 [dB] in advance. Here, −3 [dB] is a value corresponding to the above-described ratio of attenuation of '−29.3%', and may be a value set according to the definition of the cut-off frequency. In the embodiment of FIG. 6, when a noise signal having a frequency of 1591 [Hz] is output from the signal output unit 130, the difference in decibel calculated by the control unit 140 is about −2.9 [dB], which is closest to −3 [dB], so the control unit 140 may select 1591 [Hz] as the output frequency.

In addition, the control unit 140 may be configured to determine based on the selected output frequency whether the capacitor C has a defect.

In addition, if the voltage value of the battery cell B2 is 3.5 [V], the control unit 140 may convert the measured voltage values of the first battery cell B1 and the second battery cell B2 into decibel using Equation 1. The control unit 140 may convert the voltage value of the first battery cell B1 into 12.26 [dB] through the calculation result of "20×log(4.1)" using Equation 1. The control unit 140 may convert the voltage value of the second battery cell B2 into 10.88 [dB] through the calculation result of "20×log(3.5)" using Equation 1.

After that, the control unit 140 may compare the size of the converted decibel with a preset reference value. Here, the preset reference value may be a specific decibel value or range stored in the storage unit 150. Hereinafter, the preset reference value will be described as a decibel value stored in the storage unit 150.

The preset reference value may be a value obtained by converting the output voltage value of the battery cell B in an initial state into decibel. For example, if a plurality of battery cells B are included in the battery module 10 and all of the plurality of battery cells B have the same initial specifications, the preset reference value may be the same for all of the plurality of battery cells B. Conversely, if the initial specifications of the plurality of battery cells B are different so that the battery cells B have different output voltage values in an initial state, the storage unit 150 may store different reference values for the plurality of battery cells B. In this embodiment, for convenience of explanation, it is assumed that the output voltage values of the battery cells B in an initial state are all 4 [V]. For example, in the embodiment of FIG. 3, the storage unit 150 may store the preset reference values for the first battery cell B1, the second battery cell B2, the third battery cell B3 and the fourth battery cell B4. The preset reference value is a decibel calculated using Equation 1, which may be 12.04 [dB] that is the calculation result of "20×log(4)".

The control unit 140 may select an output frequency when the converted decibel size is less than or equal to the preset reference value. Preferably, the control unit 140 may select an output frequency when the converted decibel size becomes less than the preset reference value by a preset size. For example, the preset size may be preset to be 3 [dB]. That is, the control unit 140 may select a decibel smaller than the preset reference value by a size of 3 [dB] or less among the converted decibels, and select an output frequency matching with the selected decibel.

That is, preferably, the control unit may select a decibel that is different from the preset reference value by 3 [dB] among the converted decibels. However, if there is no decibel whose difference from the preset reference value is exactly 3 [dB] among the converted decibels, the control unit 140 has select a decibel having a size smaller than the preset reference value by 3 [dB] or less and having a greatest size among the converted decibels.

In a specific example, the control unit 140 may send a control signal including a [Hz] frequency information to the signal output unit 130. In addition, when a noise signal whose output frequency has a size of a [Hz] is output by the signal output unit 130, the control unit 140 may receive the voltage value b [V] of the battery cell B measured by the voltage measuring unit 110. The control unit 140 may convert the voltage value b [V] into c [dB] and compare the converted c [dB] with the preset reference value. If c [dB] is a value smaller than the preset reference value by 3 [dB], the control unit 140 may select a [Hz] frequency when the converted decibel size becomes less than the preset reference value by a preset size as the output frequency. Here, the selected output frequency may be a cut-off frequency. That is, the selected output frequency may be a boundary frequency of a frequency band that is not applied to the voltage measuring unit 110 through the filter unit 120.

The control unit 140 may be configured to determine based on the selected output frequency whether the capacitor C has a defect.

The apparatus 100 for detecting a defect of a battery pack according to another embodiment of the present disclosure may detect a defect of the capacitor C corresponding to the battery cell B based on the calculated decibel difference and the output frequency. That is, by checking the filtering performance for the output noise signal, the present disclosure has an advantage in that a defect of the capacitor C included in the filter unit 120 may be detected simply without disassembling the assembled battery pack 1.

The control unit 140 may be configured to calculate the capacitance of the capacitor C corresponding to the battery cell B by using the selected output frequency and the resistance value of the noise resistor Rn.

For example, in the embodiments of FIGS. 2 and 3, the cut-off frequency of the low pass filter provided in the filter unit 120 may be expressed using Equation 2 below.

$$Fc = 1 \div (2 \times \pi \times Rn \times C)$$ [Equation 2]

Here, Fc refers to a cut-off frequency, $\pi$ refers to a ratio of circumference (pi), Rn refers to a resistance value of the noise resistor, and C refers to a capacitance of the capacitor C.

The output frequency selected by the control unit 140 is substituted into the cut-off frequency (Fc) of Equation 2, and the resistance value of the noise resistor Rn is a value stored in the storage unit 150 in advance. Therefore, the control unit 140 may calculate the capacitance of the capacitor C by substituting $\pi$, the size of the selected output frequency and the resistance value of the noise resistor Rn in the Equation 2.

Preferably, the reference capacitance, which is the capacitance of the capacitor C in an initial state, may be stored in the storage unit 150 in advance. The control unit 140 may detect whether the capacitor C has a defect by comparing the calculated capacitance of the capacitor C with the reference capacitance.

In general, if the capacitor C has a defect, the capacitance of the capacitor C tends to be small. Therefore, if the calculated capacitance of the capacitor C is less than the reference capacitance, the control unit 140 may determine that the capacitor C has a defect.

Preferably, considering an error range of the initial capacitance of the capacitor C, the control unit 140 may determine that the capacitor C has a defect when the calculated capacitance of the capacitor C is less than the reference capacitance by 10%.

That is, the apparatus 100 for detecting a defect of a battery pack according to an embodiment of the present disclosure has an advantage of calculating the capacitance of the capacitor C and detecting a defect of the capacitor C in a non-destructive manner.

In addition, since the apparatus 100 for detecting a defect of a battery pack according to an embodiment of the present disclosure includes a compact circuit structure for noise signal output, noise signal filtering and voltage measurement, it is possible to reduce the cost for detecting a defect of the capacitor C.

A frequency-voltage table in which the output frequency of the output noise signal and the voltage value measured by the voltage measuring unit 110 are stored to be mapped with each other may be provided to the storage unit 150 to correspond to the battery cell.

That is, the storage unit 150 may have a frequency-voltage table in which the output frequency of the output noise signal and the voltage value measured by the voltage measuring unit 110 are mapped and stored whenever a noise signal is output from the signal output unit 130.

FIG. 7 is a diagram showing an example of a frequency-voltage table stored in the apparatus 100 for detecting a defect of a battery pack according to an embodiment of the present disclosure.

Referring to FIG. 7, the output frequency and the measured voltage value may be stored in the frequency-voltage table for each battery cell B. Preferably, the frequency-voltage table may store an average value of the measured maximum voltage value and the measured minimum voltage value along with the output frequency for each battery cell B.

For example, seeing the embodiment of FIG. 6, B1 may be the battery cell B.

In addition, F0 may be 10 [Hz], F1 may be 100 [Hz], F2 may be 500 [Hz], F3 may be 1000 [Hz], F4 may be 1591 [Hz], F5 may be 1800 [Hz], and F6 may be 5000 [Hz].

In addition, V10 may be 179.041 [mV], V11 may be 179.148 [mV], V12 may be 173.631 [mV], V13 may be 149.16 [mV], V14 may be 128.152 [mV], V15 may be 121.144 [mV], and V16 may be 55.572 [mV].

Preferably, the voltage value included in the column F0 may be the preset reference value for each battery cell. In addition, the average value (Vs) of the maximum voltage value and the minimum voltage value calculated for each battery cell B may be stored in the frequency-voltage table.

The control unit 140 may calculate a ratio of attenuation for every battery cell B1 to B4 from the frequency-voltage table stored in the storage unit 150. In addition, when the calculated ratio of attenuation is most approximated to about 29.3%, the control unit 140 may select a corresponding frequency as the output frequency.

In the apparatus 100 for detecting a defect of a battery pack according to an embodiment of the present disclosure, since the voltage value and the output frequency measured for each battery cell B are stored in a table, a user may be provided with information on the trend of change in the voltage value of each output frequency. Therefore, the user may grasp the tendency of the degradation degree and/or the degradation progress rate of the capacitor C through the table stored in the storage unit 150.

In another embodiment, the apparatus 100 for detecting a defect of a battery pack according to another embodiment of the present disclosure may further include a frequency-decibel table.

FIG. 8 is a diagram showing an example of a frequency-decibel table stored in the apparatus 100 for detecting a defect of a battery pack according to an embodiment of the present disclosure.

Referring to FIGS. 6, 7 and 8, B1 may be the battery cell B. In addition, F1 may be 100 [Hz], F2 may be 500 [Hz], F3 may be 1000 [Hz], F4 may be 1591 [Hz], F5 may be 1800 [Hz], F6 may be 5000 [Hz].

In addition, dB11 may be a value obtained by substituting V10 and V11 into Equation 1, dB12 may be a value obtained by substituting V10 and V12 into Equation 1, dB13 may be a value obtained by substituting V10 and V13 into Equation 1, dB14 may be a value obtained by substituting V10 and V14 into Equation 1, dB15 may be a value obtained by substituting V10 and V15 into Equation 1, and dB16 may be a value obtained by substituting V10 and V16 into Equation 1.

The control unit 140 may select a value closest to −3 [dB] for every battery cell B1 to B4 from the frequency-decibel table stored in the storage unit 150, and select a frequency corresponding to the selected value as the output frequency.

In the apparatus 100 for detecting a defect of a battery pack according to an embodiment of the present disclosure, since not only the voltage value measured for each battery cell B but also the converted decibel difference are stored in a table along with the output frequency, there is an advantage of providing information on the trend of change in the size of the decibel for each output frequency. Therefore, the user may grasp the tendency of the degradation degree and/or the degradation progress rate of the capacitor C through the table stored in the storage unit 150.

The control unit 140 may be configured to change the frequency information and send a control signal including the changed frequency information to the signal output unit 130. That is, the control unit 140 may change the frequency information included in the control signal, and the signal output unit 130 may output a noise signal while changing the size of the output frequency. In this case, the signal output unit 130 outputs a noise signal having various frequencies, and the noise signal may include an analog signal or a pulse width modulation signal.

For example, referring to FIG. 6, the control unit 140 may change the frequency information to 10 [Hz], 100 [Hz], 500 [Hz], 1000 [Hz], 1591 [Hz], 1800 [Hz] and 5000 [Hz]. In this case, the control unit may change the frequency information sequentially according to the frequency size, or may change the frequency information in a random order regardless of the frequency size.

The apparatus 100 for detecting a defect of a battery pack according to an embodiment of the present disclosure has an advantage of more accurately and precisely detecting a defect of the capacitor C by using the noise signal having a frequency of various sizes.

The control unit 140 may be configured to change the frequency information within a preset frequency range according to the initial capacitance of the capacitor C and the resistance value of the noise resistor Rn.

The storage unit 150 may store information on the initial capacitance of the capacitor C. For example, it is assumed that the information on the initial capacitance of the capacitor C stored in storage unit 150 is "C[F]±10%" and the resistance value of the noise resistor Rn is R [Ω]. In this case, the cut-off frequency may be calculated as "$1 \div (2 \times \pi \times R \times C)$".

In addition, the preset frequency range may be in the range greater than "$1 \div \{2 \times \pi \times R \times (C \times 1.1)\}$" and less than "$1 \div \{2 \times \pi \times R \times (C \times 0.9)\}$".

The apparatus 100 for detecting a defect of a battery pack according to an embodiment of the present disclosure has an advantage of shortening the time required for detecting a defect of the battery pack by changing the frequency information within the preset frequency range to dramatically reduce the time required for unnecessary calculations.

The control unit 140 may be configured to change the frequency information by preset frequency intervals within the preset frequency range. Here, the preset frequency interval may be a frequency interval set in advance based on the size of the minimum voltage that is measurable by the voltage measuring unit 110.

That is, in the apparatus 100 for detecting a defect of a battery pack according to an embodiment of the present disclosure, since the output frequency included in the noise signal is changed by the set frequency interval based on the size of the minimum voltage that is measurable by the voltage measuring unit 110, there is an advantage of shortening the time required to detect a defect of the battery pack.

The control unit 140 may be configured to send a control single including the frequency information of a predetermined reserve frequency selected from the frequency range less than the preset frequency range to the signal output unit 130 before changing the frequency information within the preset frequency range.

For example, the control unit 140 may select 0 [Hz] or a frequency included in a range greater than 0 [Hz] and smaller than the minimum frequency of the preset frequency range as a reserve frequency. In addition, the control unit 140 may send a control signal including the selected reserve frequency information to the signal output unit 130. The signal output unit 130 may output a noise signal having an output frequency corresponding to the reserve frequency information to the noise line Ln. In addition, the control unit 140 may be configured to calculate the reserve voltage value based on the voltage value of the battery cell B measured by the voltage measuring unit 110. Here, the reserve voltage value may be a target voltage value between the maximum voltage value and the minimum voltage value of the battery cell B.

For example, it is assumed that the reserve frequency is selected as z [Hz] and the signal output unit 130 outputs a noise signal having z [Hz] as the output frequency to the filter unit 120 through the noise line Ln. The voltage measuring unit 110 may measure the voltage of the battery cell B including the filtered noise signal. In addition, the control unit 140 may calculate the reserve voltage value based on the voltage value of the battery cell B received from the voltage measuring unit 110. For example, in the embodiment of FIG. 6, the control unit 140 may send a control signal having frequency information of about 10 [Hz], which serves as a basis for calculating the reference value, to the signal output unit 130.

In addition, the control unit 140 may be configured to detect a defect of the capacitor C included in the filter unit 120 based on the reserve voltage value and the preset reference value of the battery cell B. Since the configuration for detecting a defect of the capacitor C based on the calculated voltage value and the preset reference value by the control unit 140 has already been explained, the explanation about the configuration where the control unit 140 detects a defect of the capacitor C based on the reserve voltage value and the preset reference value will be omitted. At this time, if the calculated voltage value is not approximate to 0 but has an abnormally large value, the control unit 140 may immediately determine that the capacitor C has a defect, without calculating the ratio of attenuation while changing the frequency information as in the embodiment of FIG. 6.

That is, the apparatus 100 for detecting a defect of a battery pack according to an embodiment of the present disclosure may determine in advance whether the capacitor C has a serious defect by using the reserve frequency not belonging to the frequency range, before sending the control signal while changing the frequency information. Therefore, there is an advantage of detecting a serious defect of the capacitor C more quickly.

A battery pack 1 according to another embodiment of the present disclosure may include the apparatus 100 for detecting a defect of a battery pack according to an embodiment of the present disclosure described above.

For example, the battery pack 1 according to another embodiment of the present disclosure may further include a battery cell B, a battery management system (BMS), various electrical equipment (relays, fuses, etc.), and a pack case, in addition to the apparatus 100 for detecting a defect of a battery pack.

As another example, the apparatus 100 for detecting a defect of a battery pack according to the present disclosure may be applied to the battery management system (BMS). That is, the BMS according to the present disclosure may include the apparatus 100 for detecting a defect of a battery pack described above. In this configuration, at least some of the components of the apparatus 100 for detecting a defect of a battery pack may be implemented by supplementing or adding functions of components included in a conventional BMS. For example, the voltage measuring unit 110, the filter unit 120, the signal output unit 130, the control unit 140 and the storage unit 150 may be implemented as components of the BMS.

In addition, as another embodiment of the present disclosure, the apparatus 100 for detecting a defect of a battery pack may be mounted to various devices using electric energy, such as an electric vehicle, an energy storage system (ESS), and the like. In particular, the apparatus 100 for detecting a defect of a battery pack according to the present disclosure may be included in an electric vehicle. That is, the electric vehicle according to the present disclosure may include the apparatus 100 for detecting a defect of a battery pack according to the present disclosure. Here, the apparatus 100 for detecting a defect of a battery pack may be included in the battery pack 1 or may be implemented as a device separate from the battery pack 1. For example, at least a part of the apparatus 100 for detecting a defect of a battery pack may be implemented by an electronic control unit (ECU) of a vehicle. In addition, the vehicle according to the present disclosure may include a vehicle body or electronic equipment, which is typically provided in the vehicle, in addition to the apparatus 100 for detecting a defect of a battery pack. For example, the vehicle according to the present disclosure may include a contactor, an inverter, a motor, at least one ECU, and the like, in addition to the apparatus 100 for detecting a defect of a battery pack according to the present disclosure. However, the present disclosure is not particularly limited in terms of components of the vehicle other than the apparatus 100 for detecting a defect of a battery pack.

Figure 9:
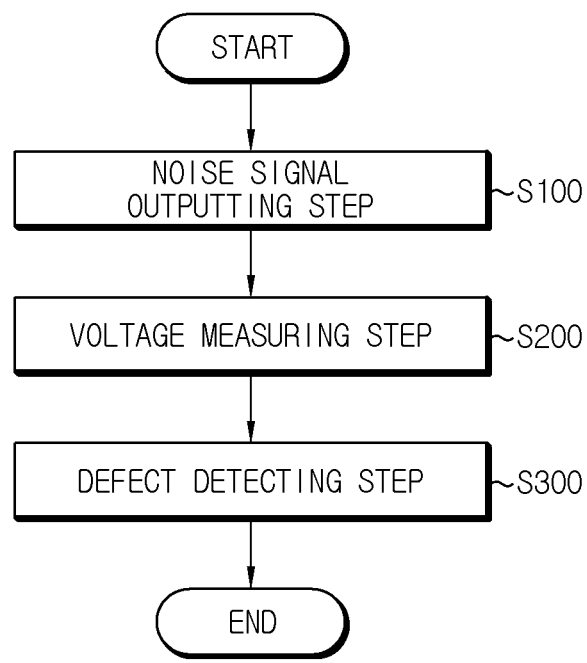
FIG. 9 is a flowchart schematically showing a method for detecting a defect of a battery pack according to another embodiment of the present disclosure.

FIG. 9 is a flowchart schematically showing a method for detecting a defect of a battery pack according to another embodiment of the present disclosure. Referring to FIG. 9, a method for detecting a defect of a battery pack according to another embodiment of the present disclosure is operated by the apparatus 100 for detecting a defect of a battery pack according to an embodiment of the present disclosure, and may include a noise signal outputting step, a voltage measuring step and a defect detecting step.

The noise signal outputting step S100 is a step of outputting a noise signal having an output frequency corresponding to frequency information when a control signal including the frequency information is input, and may be performed by the signal output unit 130.

First, the control unit 140 may send the control signal including the frequency information to the signal output unit 130. If the control signal is input, the signal output unit 130 may output the noise signal having an output frequency corresponding to the frequency information included in the control signal through the noise line Ln.

For example, if the signal output unit 130 receives a control signal including frequency information about a [Hz] from the control unit 140, the signal output unit 130 may output a noise signal having a [Hz] output frequency.

The voltage measuring step S200 is a step of measuring a voltage of the battery cell B where a partial frequency band is filtered, after the noise signal is output, and may be performed by the voltage measuring unit 110.

For example, as in the former embodiment, the filter unit 120 may include a low pass filter. In this case, the filter unit 120 may filter a high frequency component included in the noise signal. That is, the filter unit 120 may filter a high frequency component higher than a cut-off frequency. At this time, the cut-off frequency may be determined according to the resistance value of the noise resistor Rn and the capacitance of the capacitor C provided to the noise line Ln.

The voltage measuring unit 110 may measure a voltage to which the noise signal filtered by the filter unit 120 is applied, through the sensing line connected to the battery cell B. For example, in the embodiment of FIG. 2, the high frequency component of the noise signal applied to the node N is filtered through the capacitor C, and the voltage measuring unit 110 may measure the voltage of the battery cell B through the sensing line L. At this time, the voltage of the battery cell B may include an unfiltered noise signal.

For example, in the embodiment of FIG. 6, it is assumed that the reference voltage of the battery cell B is 3.7 [V], namely 3700 [mV]. When the noise signal having an output frequency of 10 [Hz] is output from the signal output unit 130, due to the noise signal output from the signal output unit 130, the voltage measuring unit 110 may measure that the maximum voltage value of the battery cell B is 425.193 [mV] and the minimum voltage value is 246.152 [mV].

The control unit 140 may store an average value of the maximum voltage value and the minimum voltage value of the battery cell B measured by the voltage measuring unit 110 in the storage unit 150 together with the frequency information included in the control signal (the output frequency included in the noise signal). Referring to FIGS. 6 and 7, the control unit 140 may store the average value (Vs) and the frequency information measured for each battery cell B in the frequency-voltage table provided in the storage unit 150.

The defect detecting step S300 is a step of detecting a defect of the capacitor C corresponding to the battery cell B based on the voltage value measured in the voltage measuring step S200 and a preset reference value, and may be performed by the control unit 140.

For example, in the embodiment of FIG. 2, the control unit 140 may detect a defect of the capacitor C based on the voltage value of the battery cell B measured in the voltage measuring step and the preset reference value.

First, the control unit 140 may calculate a ratio of the calculated target voltage value to the preset reference value. That is, the control unit 140 may calculate the ratio of attenuation of the battery cell B according to the application of the noise signal. Here, the ratio of attenuation refers to a ratio of voltage attenuation of the calculated target voltage value to the preset reference value.

In addition, the control unit 140 may select an output frequency when the calculated target voltage value is different from the preset reference value by approximately a preset ratio.

The control unit 140 may calculate the capacitance of the capacitor by substituting the selected output frequency, the resistance value of the noise resistor Rn and the value of $\pi$ stored in the storage unit 150 into Equation 2 described above.

The control unit 140 may calculate whether the capacitance of the capacitor increases or decreases by comparing the calculated capacitance of the capacitor with a known initial capacitance of the capacitor. In addition, if the capacitance of the capacitor decreases by more than a certain level from the initial capacitance, the control unit 140 may determine that the capacitor C has a defect.

In this case, the control unit 140 may notify the user that the capacitor C has a defect through an alarm unit provided thereto, a message transmission unit provided thereto, or an external alarm unit.

In general, since the capacitor C has a smaller capacitance when a defect occurs, a defect of the capacitor C may be detected by calculating the capacitance of the capacitor C by using the method for detecting a defect of a battery pack according to another embodiment of the present disclosure.

In addition, since the method for detecting a defect of a battery pack according to another embodiment of the present disclosure uses a non-destructive method, it is possible to calculate the capacitance of the capacitor C and detect a defect of the capacitor C without disassembling the battery pack 1.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery pack
10: battery module
100: apparatus for detecting a defect of a battery pack
110: voltage measuring unit
120: filter unit
130: signal output unit
140: control unit
150: storage unit
160: line branching unit

What is claimed is:

1. An apparatus for detecting a defect of a battery pack, comprising:
a voltage measurer configured to measure a voltage of a battery cell of the battery pack through a sensing line;
a filter unit having a capacitor corresponding to the battery cell and configured to filter a noise included in the voltage measured by the voltage measurer through the capacitor with respect to the corresponding battery cell;
a signal generator connected to the filter unit through a line having a noise resistor and configured to output a noise signal having an output frequency corresponding to frequency information to the filter unit when a control signal having the frequency information is input; and
a controller connected to the voltage measurer and the signal generator and configured to send the control signal having the frequency information to the signal generator, receive the voltage value of the battery cell measured by the voltage measurer and detect a defect of the capacitor included in the filter unit based on the received voltage value of the battery cell and a preset reference value, the controller being a hardware embedded processor.

2. The apparatus for detecting a defect of a battery pack according to claim 1,
wherein when the battery cell is provided in plural inside the battery pack, the controller is configured to receive a voltage value of each of the plurality of battery cells measured by the voltage measurer and detect a defect of the capacitor corresponding to each of the plurality of battery cells based on the received voltage value of each of the plurality of battery cells and the preset reference value.

3. The apparatus for detecting a defect of a battery pack according to claim 1,
wherein the filter unit further includes a filter resistor connected to the battery cell in series, and the capacitor of the filter unit is connected to a node between the filter resistor and the voltage measurer on the sensing line and is connected to the corresponding battery cell, and
the signal generator is connected to the node through a noise line having the noise resistor.

4. The apparatus for detecting a defect of a battery pack according to claim 3,
wherein when the battery cell is among a plurality of battery cells within the battery pack,
wherein the apparatus further comprises a line branching unit configured to branch at least a portion of the noise line into a plurality of branching lines, and
wherein each of the plurality of branching lines is connected to a node corresponding to each of the plurality of battery cells.

5. The apparatus for detecting a defect of a battery pack according to claim 4,
wherein the noise resistor is provided between the line branching unit and the signal generator on the noise line.

6. The apparatus for detecting a defect of a battery pack according to claim 1,
wherein the controller is configured to calculate a target voltage value based on the voltage value received for the battery cell, compare the calculated target voltage value with the preset reference value, select an output frequency according to the comparison result, and determine based on the selected output frequency whether the capacitor has a defect.

7. The apparatus for detecting a defect of a battery pack according to claim 6,
wherein the controller is configured to receive a maximum voltage value and a minimum voltage value for the battery cell from the voltage measurer and calculate the target voltage value based on a difference between the maximum voltage value and the minimum voltage value.

8. The apparatus for detecting a defect of a battery pack according to claim 6,
wherein the controller is configured to calculate a capacitance of the capacitor corresponding to the battery cell by using the selected output frequency and a resistance value of the noise resistor.

9. The apparatus for detecting a defect of a battery pack according to claim 6, further comprising:
memory provided with a frequency-voltage table to correspond to the battery cell so that the output frequency of the output noise signal and the voltage value measured by the voltage measurer are stored in the memory to be mapped with each other.

10. The apparatus for detecting a defect of a battery pack according to claim 6,
wherein the controller is configured to change the frequency information and send a control signal including the changed frequency information to the signal generator.

11. The apparatus for detecting a defect of a battery pack according to claim 10,
wherein the controller is configured to change the frequency information within a preset frequency range according to an initial capacitance of the capacitor and a resistance value of the noise resistor.

12. The apparatus for detecting a defect of a battery pack according to claim 11,
wherein the controller is configured to change the frequency information by a preset frequency interval within the preset frequency range, and
the preset frequency interval is a frequency interval set in advance based on a size of a minimum voltage measurable by the voltage measurer.

13. The apparatus for detecting a defect of a battery pack according to claim 11,
wherein before changing the frequency information within the preset frequency range, the controller is configured to:
send a control signal to the signal generator, the control signal including frequency information of a predetermined reserve frequency selected in a frequency range less than the preset frequency range,
receive the voltage value of the battery cell measured by the voltage measurer as a noise signal having an output frequency corresponding to the reserve frequency is output by the signal generator,
calculate a reserve voltage value based on the received voltage value, and
detect a defect of the capacitor included in the filter unit based on the calculated reserve voltage value of the battery cell and a preset reference voltage value.

14. A battery pack, comprising the apparatus for detecting a defect of a battery pack according to claim 1.

15. A method for detecting a defect of a battery pack, comprising: a noise signal outputting step of outputting, via a signal generator connected to a filter unit through a line having a noise resistor, a noise signal having an output frequency corresponding to frequency information, when a control signal including the frequency information is input;
a voltage measuring step of measuring a voltage of a battery cell of the battery pack at which a partial frequency band is filtered, after the noise signal is output; and
a defect detecting step of detecting a defect of a capacitor of the filter unit corresponding to the battery cell based on the voltage value measured in the voltage measuring step and a preset reference value.

* * * * *